(12) United States Patent
Yonezawa

(10) Patent No.: US 7,197,728 B2
(45) Date of Patent: Mar. 27, 2007

(54) METHOD FOR SETTING DESIGN MARGIN FOR LSI

(75) Inventor: Hirokazu Yonezawa, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 370 days.

(21) Appl. No.: 10/868,832

(22) Filed: Jun. 17, 2004

(65) Prior Publication Data

US 2004/0261044 A1    Dec. 23, 2004

(30) Foreign Application Priority Data

Jun. 17, 2003 (JP) .............................. 2003-172250

(51) Int. Cl.
*G06F 17/50* (2006.01)
(52) U.S. Cl. .................. 716/4; 716/5; 716/1
(58) Field of Classification Search .......... 716/4, 716/5, 1
See application file for complete search history.

(56) References Cited

U.S. PATENT DOCUMENTS

| | | | | |
|---|---|---|---|---|
| 5,424,985 A | * | 6/1995 | McClure et al. | 365/194 |
| 5,627,793 A | * | 5/1997 | McClure | 365/233 |
| 6,235,575 B1 | * | 5/2001 | Kasai et al. | 438/242 |
| 2003/0096492 A1 | * | 5/2003 | Yamauchi | 438/587 |

* cited by examiner

*Primary Examiner*—Sun James Lin
(74) *Attorney, Agent, or Firm*—McDermott Will & Emery LLP

(57) ABSTRACT

After predicting a relationship between a design margin set against a fabrication variation in design of an LSI and a yield, a specific design margin for attaining a given yield is calculated based on the predicated relationship. The yield is a delay yield obtained by cumulating a signal propagation delay time thereby achieving a probability that a signal propagated through a logic circuit of the LSI is delayed by a given amount of time, and the design margin is a derating factor indicating a ratio between the signal propagation delay time and a standard value of the signal propagation delay time.

15 Claims, 12 Drawing Sheets

FIG. 5
|  | A | B | C | D |
|---|---|---|---|---|
| Variation range of gate length | 0% | 4% | 8% | 12% |
| Variation range of threshold voltage | 0% | 3% | 6% | 9% |
| Variation range of gate oxide film thickness | 0% | 0.5% | 1% | 1.5% |
FIG. 6
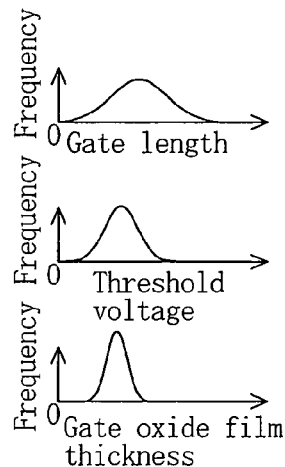
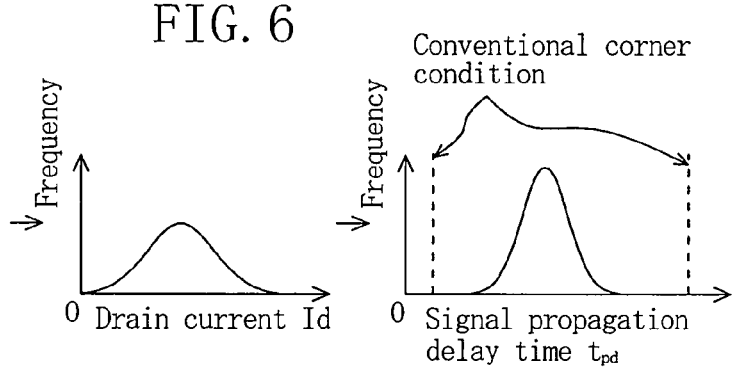
FIG. 7
|  | A | B | C | D |
|---|---|---|---|---|
| Drain current of NMOS $Id_n$ | $\mu_n$ | $\mu_n - \sigma_n$ | $\mu_n - 2\sigma_n$ | $\mu_n - 3\sigma_n$ |
| Drain current of PMOS $Id_p$ | $\mu_p$ | $\mu_p - \sigma_p$ | $\mu_p - 2\sigma_p$ | $\mu_p - 3\sigma_p$ |
| Delay yield Y[%] | 50 | 75 | 90 | 97 |
| Derating factor P | $P_0 = 1.00$ | $P_1 = 1.08$ | $P_2 = 1.15$ | $P_3 = 1.25$ |
FIG. 8
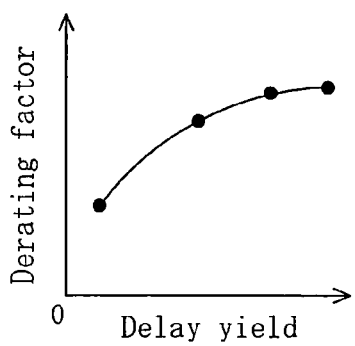

|  | E | F | G | H |
|---|---|---|---|---|
| Variation range of wiring width | 0% | 2% | 4% | 6% |
| Variation range of wiring film thickness | 0% | 1% | 2% | 3% |
| Variation range of interlayer film thickness | 0% | -1% | -2% | -3% |

FIG. 11
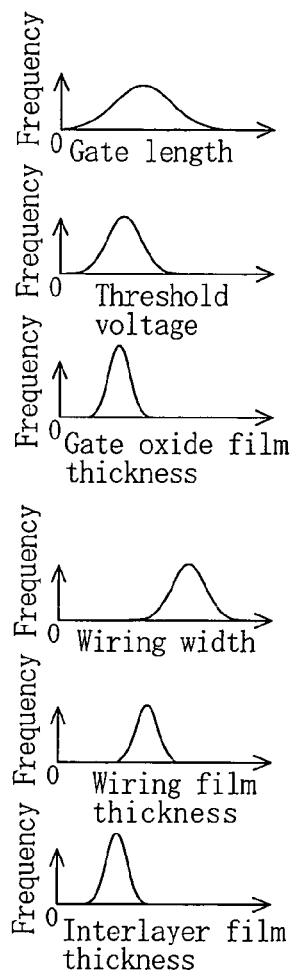
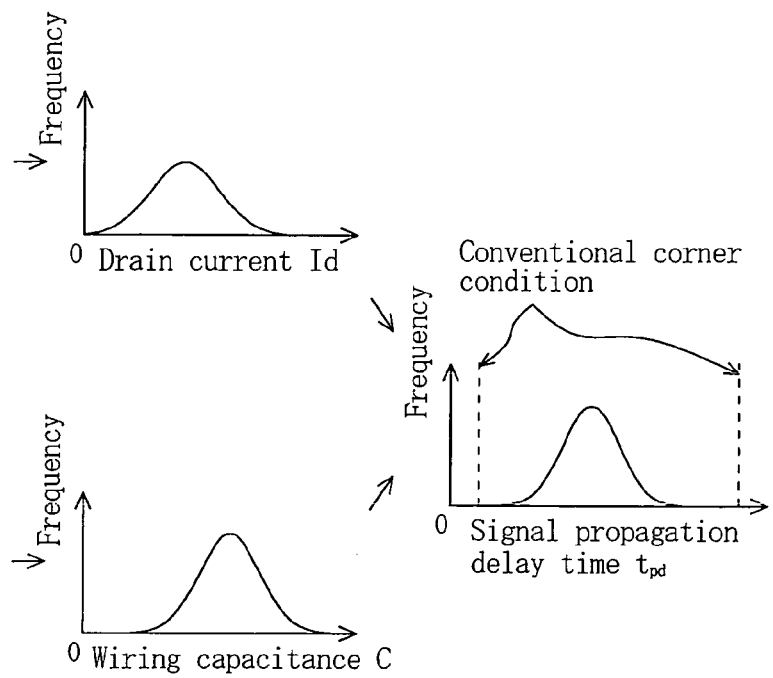
FIG. 12
| Delay yield Y[%] | 50 | 75 | 90 | 97 |
|---|---|---|---|---|
| Derating factor P | $P_0=1.00$ | $P_1=1.10$ | $P_2=1.20$ | $P_3=1.30$ |

FIG. 16
| Number | Type | Gate length | Gate width | - - - - - - | Classi-fied type | Distribution shift |
|---|---|---|---|---|---|---|
| Tr1 | NMOS | 0.13 μm | 0.5 μm | - - - - - - | A | +5% |
| Tr2 | PMOS | 0.13 μm | 1.0 μm | - - - - - - | A | +3% |
| Tr3 | NMOS | 0.13 μm | 0.8 μm | - - - - - - | B | −1% |
| - - - | - - - | - - - | - - - | - - - - - - | - - - | - - - |
FIG. 17
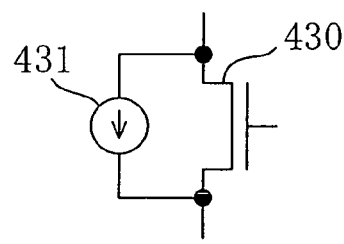
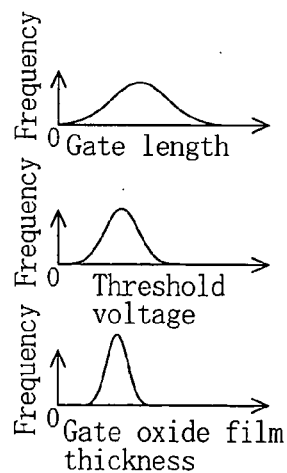
FIG. 18
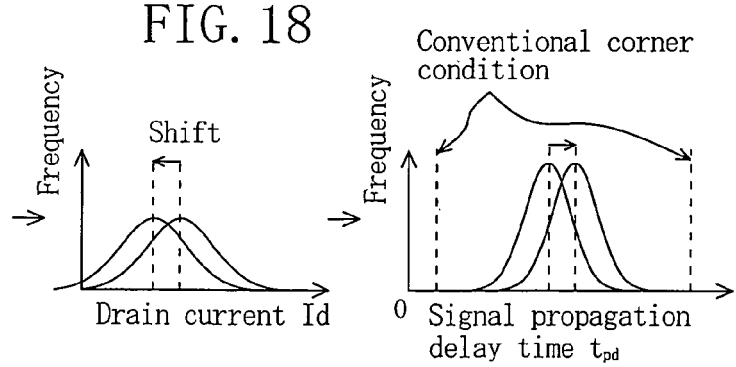

Clock signal

| Derating factor | best | typ | worst |
|---|---|---|---|
| P | 0.6 | 1 | 1.4 |
| V | 0.85 | 1 | 1.15 |
| T | 0.9 | 1 | 1.1 |

METHOD FOR SETTING DESIGN MARGIN FOR LSI

BACKGROUND OF THE INVENTION

The present invention relates to a technique to set a design margin to be employed, in design of an ASIC (Application Specific IC), a system LSI or the like, for taking performance variation derived from variation in the fabrication process into consideration.

Recently, since transistors are rapidly improved in the refinement and the degree of integration in accordance with the development of fabrication technique, a variety of functions can be realized on one chip of a CMIS (Complementary Metal Insulator Semiconductor) integrated circuit (hereinafter referred to as the LSI). In the development of such an LSI, a design margin is generally provided. Factors to be considered in setting the design margin include, as factors that affect the circuit characteristics, not only the voltage and the temperature corresponding to the operation circumstances of the circuit but also variation or fluctuation occurring in the fabrication. Signal propagation delay caused by the variation or fluctuation occurring in the fabrication of an LSI will now be described with reference to FIG. 19.

FIG. 19 is a circuit diagram of a logic circuit, which is included in an ASIC, a system LSI or the like, decomposed into a plurality of signal paths.

As shown in FIG. 19, a signal path of a logic circuit 1 included in an ASIC, a system LSI or the like can be generally decomposed into a signal path 4 in which N (wherein N is a natural number) stages of circuit cells (that is, first through Nth circuit cells) 3 provided between, for example, a pair of flip-flops 2. Each of the N stages of circuit cells 3 is generally composed of a logic circuit element such as an inverter, a NAND or a NOR. Also, the N stages of circuit cells 3 each composed of an inverter or the like are connected to one another through the signal path 4. In designing such a logic circuit 1, a signal propagation delay time (hereinafter simply referred to as the delay time) caused through the propagation of a signal through the N stages of circuit cells 3 connected by the signal path 4 should be within a given time determined on the basis of a cycle time of a clock signal input to the logic circuit 1 (in most cases, on the basis of a reciprocal of the operation frequency or the clock frequency, or a cycle obtained by multiplying such a reciprocal by an integer). This relationship is represented by the following formula (1):

Formula (1):

$$t_{cycle} \geq \sum_{i=1}^{N} t_i + t_{others}$$

wherein $t_{cycle}$ indicates the upper limit of the delay time required in the design of the logic circuit 1; $t_i$ indicates a time by which a signal input to the ith circuit cell out of the N stages of circuit cells 3 is delayed before being output (i.e., a delay time); $\Sigma t_i$ indicates the sum of signal propagation delay times $t_i$ caused in the respective circuit cells provided between the pair of flip-flops 2; and $t_{others}$ indicates the sum of set-up times of the pair of flip-flops 2 and the skew of the clock signal.

In general, the design margin is set in consideration of the above-described delay time and hence is represented by the following formula (2) by using coefficients P, V and T designated as derating factors indicating, in the form of coefficients, various delay varying factors for delaying the propagation of a signal:

$$t_{worst} = t_{typ} \times P_{worst} \times V_{worst} \times T_{worst} \qquad \text{Formula (2):}$$

wherein $t_{worst}$ is the worst value of the delay time $\Sigma t_i$; $t_{typ}$ is a standard value of the delay time $\Sigma t_i$; P is a derating factor indicating, in the form of a coefficient, fabrication variation as the delay varying factor; V is a derating factor indicating, in the form of a coefficient, a power voltage range as the delay varying factor; and T is a derating factor indicating, in the form of a coefficient, a temperature range as the delay varying factor.

In using such derating factors, the standard value $t_{typ}$ of the delay time $\Sigma t_i$ is first obtained, and the worst value of the delay time obtained under the worst conditions can be easily estimated as a value obtained by multiplying the standard value $t_{typ}$ by the worst values of the respective derating factors. As a result, the logic circuit can be designed in a labor-saving manner. The specific values of the derating factors are listed in FIG. 20.

FIG. 20 is a diagram for showing the best values (in the column of "best"), the standard values (in the column of "typ") and the worst values (in the column of "worst") of the derating factors P, V and T used in the formula (2).

As shown in FIG. 20, each derating factor P, V or T has the best value, the standard value and the worst value. Among these values, the best value and the worst value are determined by assuming the standard value as 1. When the worst values of these derating factors are substituted in the formula (2), the worst value $t_{worst}$ of the delay time can be calculated in accordance with the following formula (3). On the other hand, the best value $t_{best}$ of the delay time can be similarly calculated in accordance with the following formula (4). Under conditions where the signal propagation is delayed by times corresponding to the best value $t_{best}$ and the worst value $t_{worst}$ of the delay time thus calculated, the operation of the LSI is checked at the time of the circuit design.

$$t_{worst} = t_{typ} \times 1.4 \times 1.15 \times 1.1 \qquad \text{Formula (3):}$$

$$t_{best} = t_{typ} \times 0.6 \times 0.85 \times 0.9 \qquad \text{Formula (4):}$$

The quality of an LSI can be safely secured by excessively setting a design margin for the LSI, but although it is thus safely secured, the circuit design may become wasteful on the contrary. For example, since an excessive margin increases the circuit scale, the performance such as the operation frequency of the LSI is lowered. Accordingly, without a technique to evaluate not excessive but appropriate design margin and to design an LSI on the basis of the evaluated design margin, it is difficult to efficiently develop an optimum LSI, such as a recent digital signal processor, satisfactory in both the performance and the quality.

However, it is not easy to set an appropriate design margin against the fabrication variation because the occurrence mechanism of the fabrication variation is complicated. Specifically, the variation derived from the voltage or the temperature can be set on the basis of response of a circuit to one variable while there are a large number of variables (process variables) for determining the fabrication variation, and therefore, it is difficult to set a design margin against the fabrication variation. Therefore, a method for setting a design margin for an LSI as shown in FIG. 21 has been conventionally employed. Now, this method will be described in detail.

FIG. 21 is a flowchart for showing procedures in the conventional method for setting a design margin for an LSI.

Also, FIG. 22 is a table for showing variation ranges of process variables determined in a corner condition setting step S14 of the conventional method for setting a design margin for an LSI.

As shown in FIG. 21, in a test chip design step S10, a test chip of an LSI to be fabricated is first designed.

Next, in a test chip prototype step S11, the test chip designed in the test chip design step S10 is fabricated.

Then, in a test chip evaluation step S12, as a characteristic (a standard characteristic) used as a standard of an element (such as a transistor) included in the test chip fabricated in the test chip prototype step S11, and for example, as the standard characteristic of a transistor, a voltage-current characteristic of the transistor is measured.

Next, in a standard parameter extraction step S13, on the basis of the standard characteristic of the test chip measured in the test chip evaluation step S12, a standard value of a SPICE (Simulation Program with Integrated Circuit Emphasis) parameter set to be used in a circuit simulation step S15 described below is extracted.

Then, in a corner condition setting step S14, the range (variation range) within which the SPICE parameter set extracted in the standard parameter extraction step S13 is allowed to vary during the fabrication process is determined. Specifically, on the basis of variation specifications 20 for specifying the variation ranges of process variables during the fabrication process, the variation ranges of the process variables, such as a gate length, a threshold voltage and a gate oxide film thickness, derived from the fabrication variation are determined as shown in FIG. 22.

FIG. 22 shows examples of the variation ranges of the process variables determined on the basis of the variation specifications 20.

As shown in FIG. 22, on the basis of the variation specifications 20, the variation ranges, namely, the minimum values (listed in the column of "min") and the maximum values (listed in the column of "max") of the respective process variables, such as the gate length, the threshold voltage and the gate oxide film thickness, derived from the fabrication variation can be determined. When these variation ranges of the process variables are made to influence the standard value of the SPICE parameter obtained on the basis of the standard characteristic of the transistor, a corner condition, namely, the minimum value and the maximum value, of the SPICE parameter can be obtained. In general, in the corner condition of the SPICE parameter determined on the basis of the variation specifications 20, as the maximum value (namely, the upper limit), a value obtained by subtracting a triple value of a standard deviation σ from a standard value μ of the variation range of the process variable is selected. On the other hand, as the minimum value (lower limit) of the corner condition, a value obtained by adding the triple of the standard deviation σ to the standard value μ of the variation range of the process variable is selected.

Next, in the circuit simulation step S15, circuit simulation is performed by using a simple circuit model 21 by employing the standard value of the SPICE parameter and the corner condition. Specific procedures in this step are shown in FIG. 23.

FIG. 23 is a diagram for showing, in detail, the circuit simulation step S15 of FIG. 21 and an LSI delay variation prediction step S16 performed thereafter.

As shown in FIG. 23, the circuit simulation step S15 specifically includes a standard SPICE simulation step S15a and a slow SPICE simulation step S15b. In the standard SPICE simulation step S15a, the SPICE simulation is performed by using the standard value of the SPICE parameter (that is, a standard SPICE parameter), so as to calculate a standard delay time $t_a$. On the contrary, in the slow SPICE simulation step S15b, the SPICE simulation is performed by using the maximum value of the corner condition of the SPICE parameter (that is, a slow SPICE parameter), so as to calculate a worst delay time $t_b$. For this purpose, as a net list obtained on the assumption of a simple two-input NAND (2NAND) as the circuit model, a standard net list is prepared for the standard SPICE simulation step S15a, and a slow net list is prepared for the slow SPICE simulation step S15b.

Furthermore, as shown in FIG. 23, the LSI delay variation prediction step S16 specifically includes a derating factor calculation step S16'. In the derating factor calculation step S16', shift of the worst standard time $t_b$ calculated in the slow SPICE simulation step S15b from the standard delay time $t_a$ calculated in the standard SPICE simulation step S15a is calculated by using the following formula (5):

$$P=\{(\text{worst delay time})/(\text{standard delay time})\}\geq 1 \quad \text{Formula (5):}$$

A delay variation ratio thus calculated corresponds to the derating factor P indicating, in the form of a coefficient, the fabrication variation as the delay varying factor. Specifically, the derating factor P thus calculated is set as the design margin against the fabrication variation of the LSI.

As described so far, in the conventional method for setting a design margin for an LSI, the standard SPICE parameter to be used in the circuit simulation is extracted on the basis of the standard characteristic of the transistor measured by using the test chip of the LSI, and the corner condition of the extracted SPICE parameter is determined on the basis of the variation specifications 20 of the general process variables. Also, the response of the circuit delay is obtained through the circuit simulation by using the corner condition of the SPICE parameter determined on the basis of the variation specifications 20 of the process variables, and the derating factor calculated on the basis of the circuit delay is set as the design margin.

However, in the conventional method for setting a design margin for an LSI, since the corner condition (the upper and lower limits) of the SPICE parameter to be used in the SPICE simulation is determined on the basis of the variation specifications 20 of the process variables shown in FIG. 22, a combination of specification values actually minimally possible is used. For example, the upper limit of the corner condition of the SPICE parameter corresponds to a combination of the maximum values (max) of all of the gate length, the threshold voltage and the gate oxide film thickness shown in FIG. 22. However, there is very small probability that these process variations are simultaneously the maximum, and hence, such a combination is actually minimally possible. Thus, in the conventional method, the SPICE simulation is performed by using the SPICE parameter having such an unrealistic corner condition. Therefore, the derating factor calculated on the basis of the delay time calculated through the SPICE simulation tends to have an excessive value. In other words, in the conventional method, an excessive design margin tends to be set. Also, since the circuit model 21 used in the circuit simulation step S15 is set as a simple model as shown in FIG. 23, it cannot be said that the current model is influenced by the actual features of the LSI. Therefore, the design margin set by the conventional method may have an excessive or insufficient value.

SUMMARY OF THE INVENTION

In consideration of the aforementioned conventional disadvantages, an object of the invention is, in design of an LSI, making the actual features of the LSI influence a design margin to be set while avoiding setting the design margin to an excessive value.

In order to achieve the object, the first method for setting a design margin for an LSI of this invention includes the steps of predicting a relationship between a design margin to be set against fabrication variation in designing the LSI and a yield; and calculating a specific design margin for attaining a given yield on the basis of the predicted relationship.

In the first method for setting a design margin for an LSI, the relationship between the design margin set against the fabrication variation and the yield of the LSI can be predicted, and therefore, the specific design margin for attaining the given yield can be calculated. In other words, the specific design margin in accordance with the yield required of the LSI to be fabricated can be set against the fabrication variation of the LSI. Accordingly, in the design of the LSI, it is possible to avoid setting an excessive design margin against the fabrication variation.

In the first method for setting a design margin for an LSI, preferably, the yield is a delay yield obtained by cumulating, on a signal propagation delay time, probability that a signal propagated through a logic circuit of the LSI is delayed by a given time, and the design margin is a derating factor indicating a ratio between the signal propagation delay time and a standard value of the signal propagation delay time.

Thus, the relationship between the delay yield obtained by cumulating, on a delay time of a signal propagated through the logic circuit of the LSI (namely, the signal propagation delay time), the probability that the signal propagated through the logic circuit of the LSI is delayed by the given time, and the derating factor indicating the ratio between the signal propagation delay time and the standard value thereof can be predicted. In other words, the ratio that the signal propagation delay time required of the LSI to be fabricated is satisfied (namely, the delay yield) can be simply predicted on the basis of the derating factor set as the design margin against the fabrication variation of the LSI. Therefore, the aforementioned effect can be definitely attained.

In the first method for setting a design margin for an LSI, the relationship is predicted in the step of predicting a relationship preferably by performing circuit simulation by using, as parameters, simulation information extracted from circuit characteristics of a test chip influenced by design features of the LSI on the basis of a circuit model influenced by the design features of the LSI.

Thus, the relationship between the yield of the LSI and the design margin set against the fabrication variation of the LSI can be predicted by performing the circuit simulation by using, as the parameters, the simulation information extracted from the circuit characteristic of the test chip influenced by the design feature of the LSI and by using the circuit model. Therefore, the simulation information used as the parameters of the circuit simulation can be influenced by the circuit characteristic of the test chip, and the circuit simulation can be influenced by the circuit model of the LSI. Accordingly, the circuit simulation performed for determining the relationship between the yield of the LSI and the design margin set against the fabrication variation of the LSI can be influenced by the actual features of the LSI. As a result, an appropriate and realistic design margin neither excessive nor insufficient can be set against the actual fabrication variation of the LSI.

In the case where the test chip and the circuit model are used, the design features of the LSI influenced by the circuit model preferably includes at least information about a critical path of the LSI.

Thus, the feature of the critical path, out of the signal paths included in the logic circuit of the LSI, that determines the operation speed of the LSI can be made to influence the circuit model used in the circuit simulation. Therefore, the yield of the LSI can be more accurately predicted. As a result, the aforementioned effect can be definitely attained.

The second method of this invention for setting a design margin for an LSI in which a design margin to be employed in design of the LSI is set against fabrication variation, includes a first step of measuring a circuit characteristic of the LSI by using a test chip influenced by a design feature of the LSI; a second step of constructing a circuit model influenced by the design feature of the LSI; a third step of extracting, at least from the circuit characteristic measured in the first step, simulation information necessary for circuit simulation performed by using the circuit model constructed in the second step; a fourth step of performing the circuit simulation by using the simulation information extracted in the third step as parameters and by using the circuit model constructed in the second step, whereby calculating a delay yield obtained by cumulating, on a signal propagation delay time, probability that a signal propagated through a logic circuit of the LSI is delayed by a given time, and a derating factor indicating a ratio between the signal propagation delay time and a standard value of the signal propagation delay time; a fifth step of determining a relationship between the delay yield and the derating factor calculated in the fourth step; and a sixth step of calculating a specific derating factor for attaining a given delay yield on the basis of the relationship determined in the fifth step and setting the specific derating factor as a specific design margin against the fabrication variation.

In the second method for setting a design margin for an LSI, the circuit characteristic of the test chip influenced by the design feature of the LSI is measured in the first step and the circuit simulation can be performed by using, as the parameters, the simulation information extracted from the measured circuit characteristic in the fourth step. Also, in the circuit simulation performed in the fourth step, the circuit model influenced by the design feature of the LSI is used, and therefore, the realistic delay yield and derating factor influenced by the actual feature of the LSI can be calculated in the fifth step. Accordingly, an appropriate and realistic specific design margin neither excessive nor insufficient can be set in the sixth step.

Furthermore, in the second method for setting a design margin for an LSI, the delay yield obtained by cumulating, on the delay time, the probability that a signal propagated through the logic circuit of the LSI is delayed by a given time, and the derating factor indicating the ratio between the signal propagation delay time and the standard value thereof can be calculated in the fourth step. In addition, the relationship between the delay yield and the derating factor can be determined in the fifth step. In other words, the ratio that the LSI satisfies the signal propagation delay time required of the LSI to be fabricated (namely, the delay yield) can be predicted on the basis of the derating factor set as the specific design margin.

Moreover, in the second method for setting a design margin for an LSI, on the basis of the relationship between the delay yield and the derating factor determined in the fifth step, the specific derating factor for attaining the given delay yield can be set as the specific design margin against the LSI in the sixth step. In other words, the design margin (specific design margin) in accordance with the delay yield required of the LSI to be fabricated can be set against the fabrication variation of the LSI. Accordingly, in the design of the LSI, it is possible to avoid setting an excessive design margin against the fabrication variation of the LSI.

In the second method for setting a design margin for an LSI, the simulation information extracted in the third step preferably includes at least a variation component of a transistor characteristic derived from the fabrication variation.

Thus, at least the variation component of the transistor characteristic derived from the fabrication variation of the LSI can be extracted in the third step from the circuit characteristic measured in the first step. Therefore, in the fourth step, the delay yield and the derating factor can be calculated on the basis of the variation component of the transistor characteristic regarded as the delay varying factor for a signal propagated through the logic circuit included in the LSI. In other words, the circuit simulation performed for determining the relationship between the delay yield of the LSI and the design margin to be set against the fabrication variation of the LSI can be influenced by the realistic circuit characteristic of the LSI. Accordingly, an appropriate and realistic specific design margin neither excessive nor insufficient can be set against the fabrication variation of the LSI in the sixth step.

In the case where the simulation information includes the variation component of the transistor characteristic, in the circuit simulation performed in the fourth step, the parameters are preferably changed in such a manner that drain currents of an N-channel MIS transistor and a P-channel MIS transistor included in the circuit model are both increased or reduced.

Thus, since merely the case where the drain currents of both the NMIS transistor and the PMIS transistor are increased or reduced can be dealt with, procedures up to the sixth step of setting the specific derating factor can be efficiently and easily performed. It is noted that such a case alone can be dealt with in consideration of the similarity of the NMIS transistor and the PMIS transistor.

In the second method for setting a design margin for an LSI, the simulation information extracted in the third step preferably includes at least a variation component of the transistor characteristic and a variation component of a wiring characteristic derived from the fabrication variation.

Thus, in the third step, at least the variation components of the transistor characteristic and the wiring characteristic derived from the fabrication variation of the LSI can be extracted from the circuit characteristic measured in the first step. Therefore, in the fourth step, the delay yield and the derating factor can be calculated on the basis of the variation components of the transistor characteristic and the wiring characteristic regarded as the delay varying factors for a signal propagated through the logic circuit included in the LSI. In other words, the circuit simulation performed for determining the relationship between the delay yield of the LSI and the design margin set against the fabrication variation of the LSI can be influenced by the realistic circuit characteristic of the LSI. Accordingly, an appropriate and realistic specific design margin neither excessive nor insufficient can be set against the fabrication variation of the LSI in the sixth step.

In the second method for setting a design margin for an LSI, the simulation information extracted in the third step preferably includes at least random variation derived from the fabrication variation.

Thus, in the third step, at least a variation component randomly generated due to the fabrication variation of the LSI (namely, the random variation) can be extracted from the circuit characteristic measured in the first step. Therefore, in the fourth step, the delay yield and the derating factor can be calculated on the basis of the random variation regarded as the delay varying factor for a signal propagated through the logic circuit included in the LSI. In other words, the circuit simulation performed for determining the relationship between the delay yield of the LSI and the design margin set against the fabrication variation of the LSI can be influenced by the realistic circuit characteristic of the LSI. Accordingly, an appropriate and realistic specific design margin can be set against the fabrication variation of the LSI in the sixth step.

In the second method for setting a design margin for an LSI, the simulation information extracted in the third step preferably includes at least random variation derived from the fabrication variation and systematic variation.

Thus, in the third step, at least a variation component systematically generated due to the fabrication variation of the LSI (namely, the systematic variation) and the random variation can be extracted from the circuit characteristic measured in the first step. Therefore, in the fourth step, the delay yield and the derating factor can be calculated on the basis of the random variation and the systematic variation regarded as the delay varying factors for a signal propagated through the logic circuit included in the LSI. In other words, the circuit simulation performed for determining the relationship between the delay yield of the LSI and the design margin set against the fabrication variation of the LSI can be influenced by the realistic circuit characteristic of the LSI. Accordingly, an appropriate and realistic specific design margin can be set against the fabrication variation of the LSI in the sixth step.

In the case where the simulation information includes information about the systematic variation, the systematic variation is preferably typified into a plurality of types on the basis of dependency, on a mask layout, of a current passing through a transistor included in the circuit model.

Thus, the delay yield and the derating factor can be calculated on the basis of the systematic variation typified into a plurality of types on the basis of the dependency, on the mask layout, of the current passing through the transistor included in the circuit model. Accordingly, the aforementioned effect can be definitely attained.

Also, in the case where the simulation information includes information about the systematic variation, in the circuit simulation performed in the fourth step, the systematic variation is preferably expressed as a dummy current source connected in parallel to a transistor included in the circuit model.

Thus, the systematic variation can be expressed as a dummy current source connected in parallel to the transistor included in the circuit model used in the fourth step, namely, as a current source for correction described in the format of a net list alone. Therefore, the feature of the systematic variation for causing "shift" of the current passing through the transistor can be made to appropriately influence the delay yield and the derating factor calculated through the circuit simulation. Accordingly, the aforementioned effect can be definitely attained.

In the first or second method for setting a design margin for an LSI, the relationship is preferably corrected on the basis of a difference between the given delay yield and an actual delay yield of the LSI designed and fabricated on the basis of the specific design margin.

Thus, the difference between the actual delay yield of the LSI actually fabricated on the basis of the specific design margin set in the aforementioned manner and the delay yield predicted before the fabrication can be made to influence the design margin against the fabrication variation and the delay yield of LSIs to be fabricated thereafter. Accordingly, the design margin to be set for the LSIs to be developed thereafter can be more realistic and accurate. As a result, setting of an excessive or insufficient design margin can be suppressed.

BRIEF DESCRIPTION OF THE DRAWINGS

FIG. 5 is a table for showing examples of some SPICE parameters changed into variables for satisfying the condition of FIG. 3;

FIG. 6 is a diagram for showing distributions of process variables input to a circuit simulator in the SPICE simulation step S105 of FIG. 1, a distribution of a drain current of a MOS transistor analyzed by using a random number set (a set of SPICE parameters) according to the distributions of the input process variables, and a distribution (delay distribution) of a signal propagation delay time output from the circuit simulator;

FIG. 7 is a table for showing the drain currents, derating factors and delay yields calculated on the basis of the distributions of the signal propagation delay time of FIG. 6 obtained at the points A through D of FIG. 3;

FIG. 8 is a diagram for showing the relationship between the derating factor and the delay yield obtained in a prediction function specifying step S108 of FIG. 1;

FIG. 11 is a diagram for showing distributions of process variables input to a circuit simulator, distributions of a drain current and a wiring capacitance of a MOS transistor analyzed by using random number sets (a set of SPICE parameters and a set of parameters of a net list) according to the distributions of the input process variables and a delay distribution output from the circuit simulator in a SPICE simulation step S105 of the method for setting a design margin for an LSI according to Embodiment 2 of the invention;

FIG. 12 is a diagram for showing the relationship between a derating factor and a delay yield obtained in a prediction function specifying step S108 of the method for setting a design margin for an LSI according to Embodiment 2 of the invention;

FIG. 16 is a diagram for showing an example of classification of transistors included in a critical path of a logic circuit included in an LSI in an LSI design feature extraction step S401 of FIG. 15;

FIG. 17 is a diagram of a dummy current source inserted in a net list of a circuit model used in a SPICE simulation step S105 of FIG. 15;

FIG. 18 is a diagram for showing distributions of process variables input to a circuit simulator, a distribution of a drain current of a MOS transistor analyzed by using a random number set (a set of SPICE parameters) according to the distributions of the input process variables, and a delay distribution output from the circuit simulator in the SPICE simulation step S105 of FIG. 15;

DETAILED DESCRIPTION OF THE INVENTION

Embodiment 1

Now, a method for setting a design margin for an LSI according to Embodiment 1 of the invention will be described with reference to the accompanying drawings.

Figure 1:
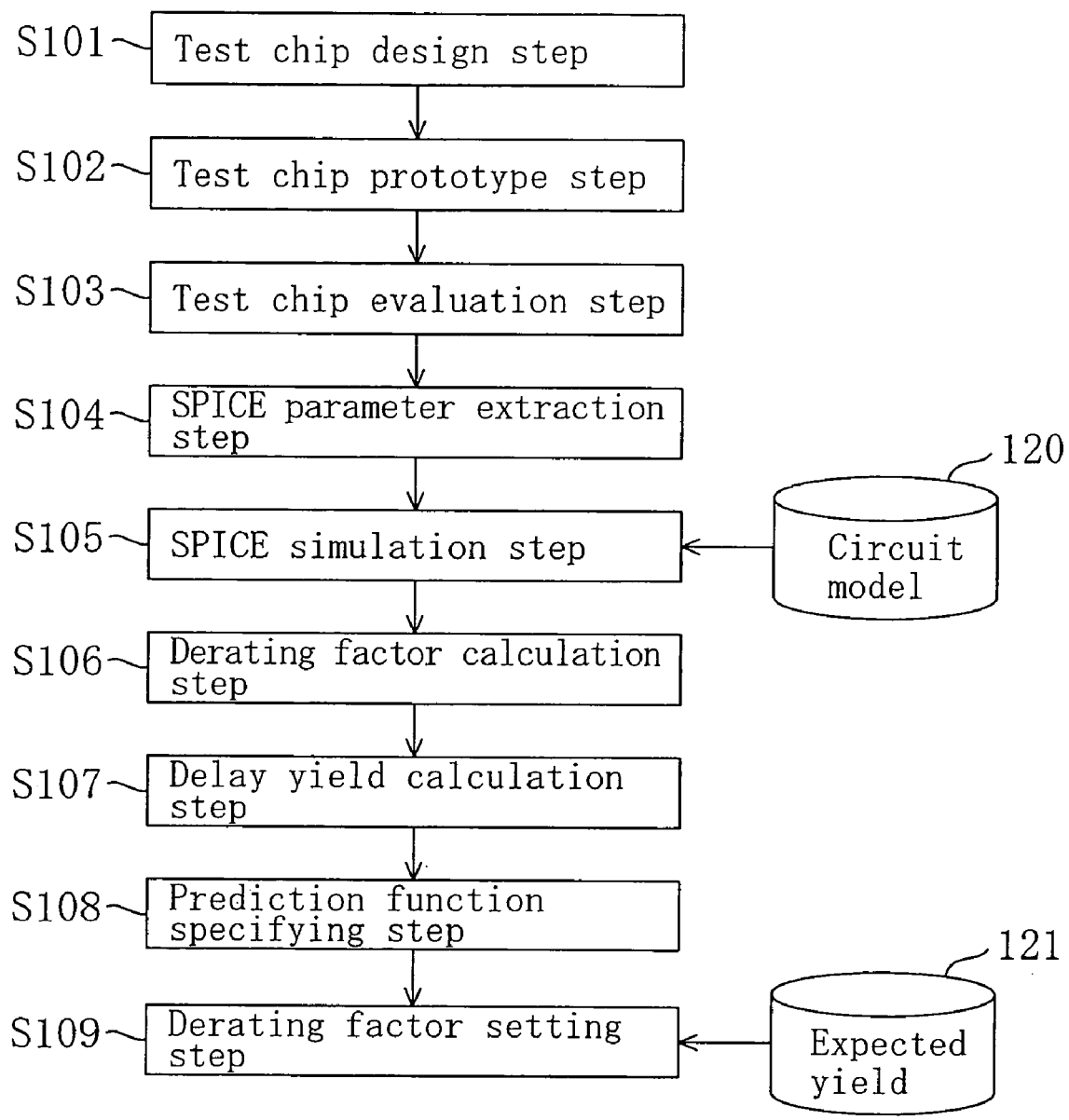
FIG. 1 is a diagram for showing procedures in a method for setting a design margin for an LSI according to Embodiment 1 of the invention.

FIG. 1 is a diagram for showing procedures in the method for setting a design margin for an LSI of Embodiment 1. In the method of this embodiment, a design margin is set against fabrication variation with the fabrication variation of a CMOS transistor, that is, a kind of CMIS transistor, regarded as a delay varying factor.

As shown in FIG. 1, first in a test chip design step S101, a test chip mounting a variety of transistors to be included in an LSI to be fabricated is designed.

Next, in a test chip prototype step S102, a plurality of test chips designed in the test chip design step S101 are prototyped.

Then, in a test chip evaluation step S103, transistor characteristics, that is, for example, at least current-voltage characteristics, of NMOS transistors and PMOS transistors out of the various transistors mounted on the test chips prototyped in the test chip prototype step S102 are measured.

Figure 2:
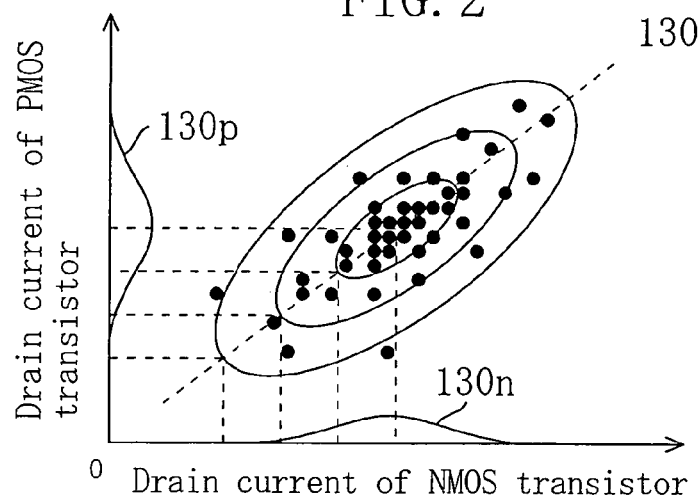
FIG. 2 is a graph for showing a distribution of drain currents of a NMOS transistor and a PMOS transistor measured in a test chip evaluation step S103 of FIG. 1.

FIG. 2 is a graph in which the current characteristics of MOS transistors measured by using the test chips prototyped in the test chip prototype step S102 are plotted, wherein the abscissa indicates the saturation drain current of an NMOS transistor and the ordinate indicates the saturation drain current of a PMOS transistor.

As shown in FIG. 2, the current characteristic of the MOS transistors measured in the test chip evaluation step S103 is expressed as one point representing the saturation drain current of the NMOS transistor and the saturation drain current of the PMOS transistor. Also, in the test chip evaluation step S103, the plural test chips prototyped in the test chip prototype step S102 are used for measuring the current-voltage characteristics of the plural MOS transistors mounted on each test chip, and therefore, a plurality of points are plotted in the graph of FIG. 2. The saturation drain currents of the NMOS transistors thus plotted are distributed as an NMOS distribution 130n of FIG. 2. On the other hand, the saturation drain currents of the PMOS transistors are distributed as a PMOS distribution 130p of FIG. 2. However, the measurement times (shown along the ordinate) of, for example, the NMOS distribution 130n of FIG. 2 do not correspond to the saturation drain current of the PMOS transistor indicated by the ordinate because the distribution is simply shown.

At this point, each of the NMOS distribution 130n and the PMOS distribution 130p is approximated with a one-dimensional normal distribution function, and a standard value (expected value) $\mu$ and a standard deviation $\sigma$ of each distribution are calculated. On the basis of these values, a straight line passing a point A ($\mu_n$, $\mu_p$), a point B ($\mu_n-\sigma_n$, $\mu_p-\sigma_p$), a point C ($\mu_n-2\sigma_n$, $\mu_p-2\sigma_p$) and a point D ($\mu_n-3\sigma_n$, $\mu_p-3\sigma_p$) is assumed. This straight line is shown in FIG. 3, whereas $\mu_n$ and $\sigma_n$ respectively indicate the standard value (expected value) and the standard deviation calculated on the basis of the normal distribution function of the NMOS distribution 130n and $\mu_p$ and $\sigma_p$ respectively indicate the standard value and the standard deviation calculated on the basis of the normal distribution function of the PMOS distribution 130p.

Figure 3:
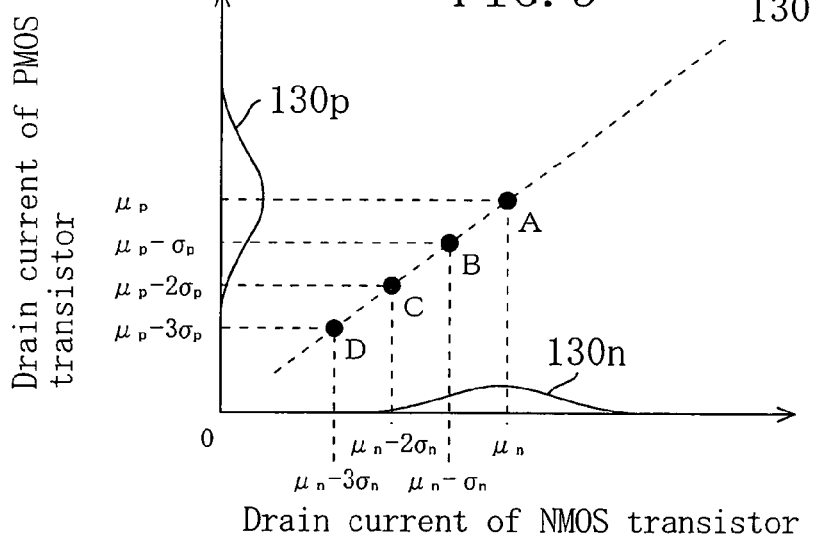
FIG. 3 is a diagram for showing a condition for changing the drain currents of the NMOS transistor and the PMOS transistor employed as a SPICE parameter in a SPICE simulation step S105 of FIG. 1.

FIG. 3 shows the points A through D and the straight line 130 passing these points.

As shown in FIG. 3, the respective points A through D indicate different values of the saturation drain currents. The current-voltage characteristic of, for example, the NMOS transistor in which the saturation drain current corresponding to each of these points is measured is shown in an image diagram of FIG. 4. With respect to the current-voltage characteristic of the PMOS transistor, a similar image diagram is obtained.

Figure 4:
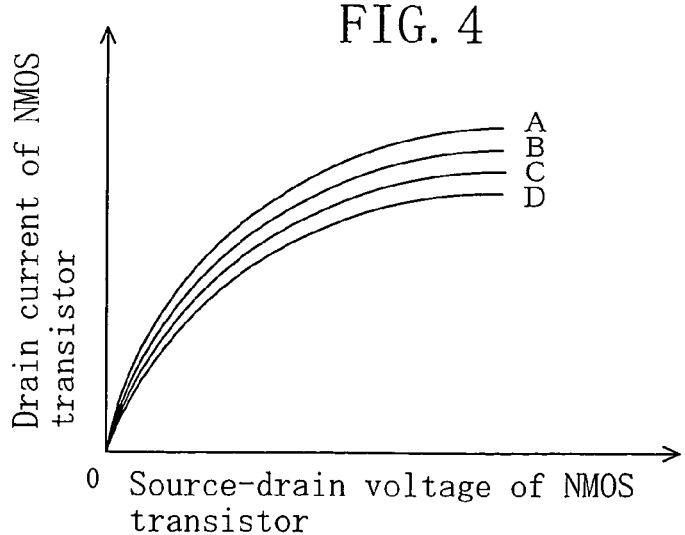
FIG. 4 is an image diagram of current-voltage characteristics of the MOS transistors included in a test chip in which drain currents corresponding to points A through D of FIG. 3 are respectively measured.

As shown in FIG. 4, the current-voltage characteristics of the NMOS transistor respectively corresponding to the points A through D are expressed as different current-voltage characteristic curves due to the fabrication variation. The four current-voltage characteristics shown in FIG. 4 respectively correspond to the points A through D in the ascending order of the drain current of the NMOS transistor.

Figures 19, 20:
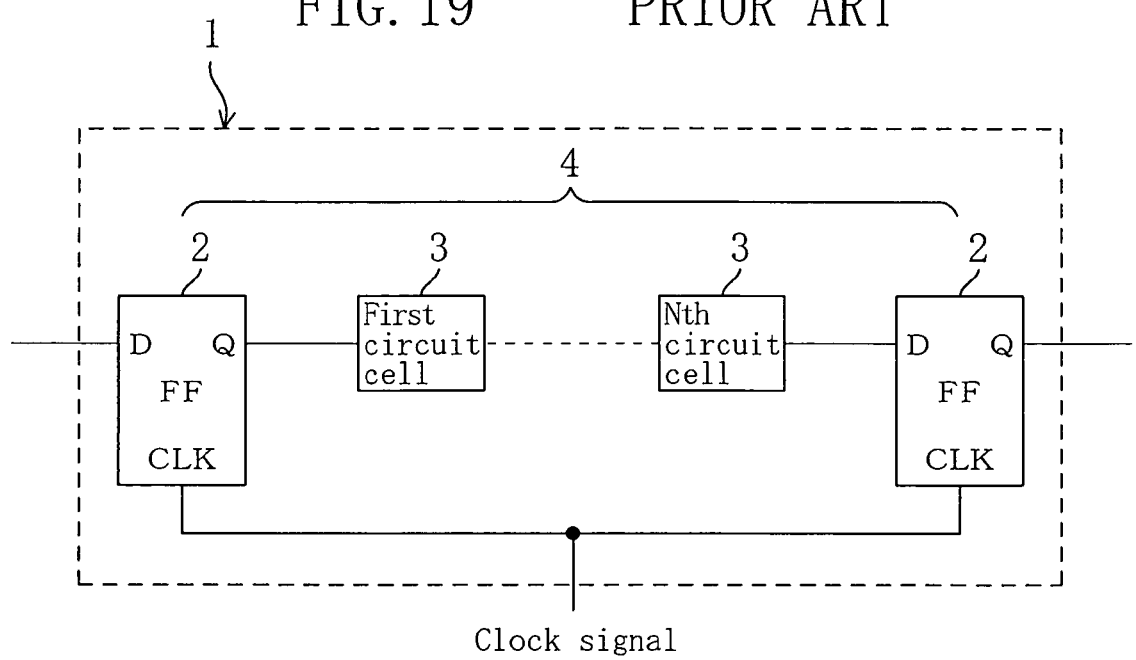
FIG. 19 is a circuit diagram of a logic circuit 1 included in an ASIC or a system LSI decomposed into a plurality of signal paths 4.
FIG. 20 is a diagram for showing best values, standard values and worst values of derating factors P, V and T obtained in a conventional method for setting a design margin for an LSI.
Figure 21:
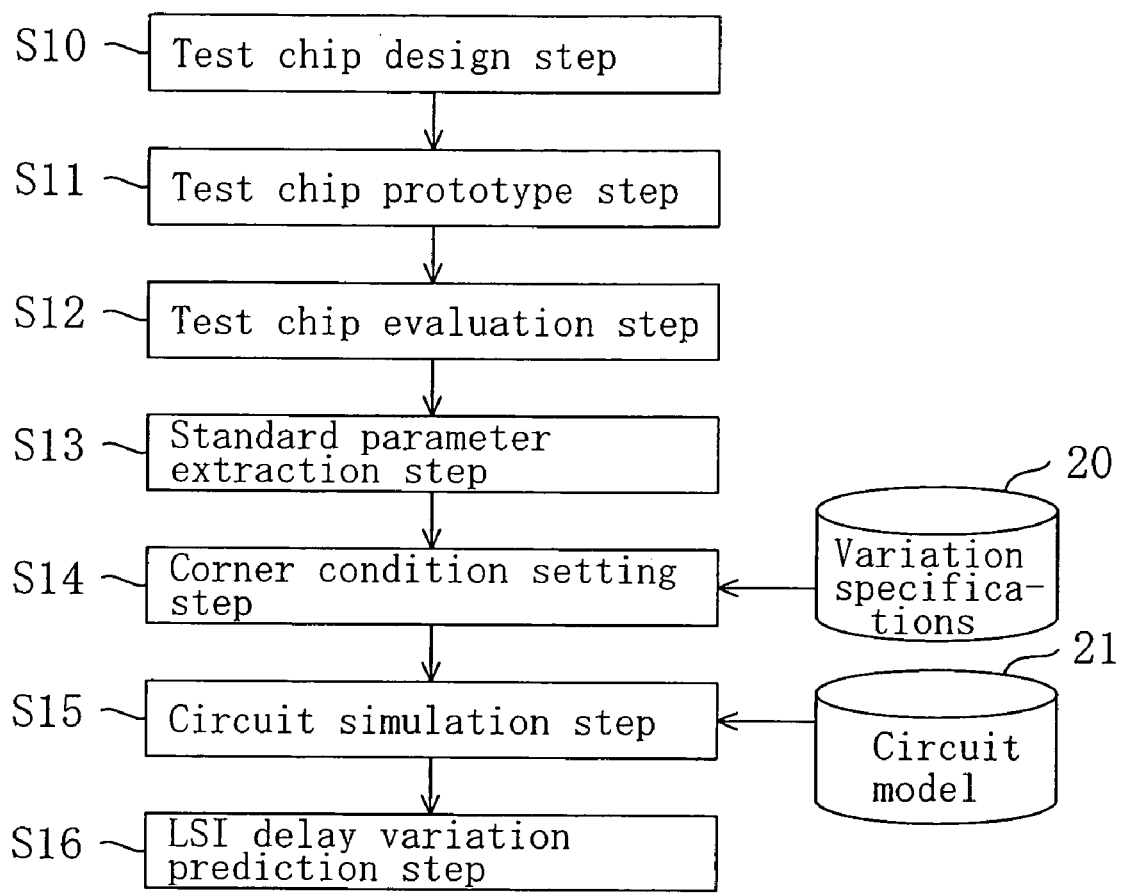
FIG. 21 is a diagram for showing procedures in the conventional method for setting a design margin for an LSI.
Figures 22, 23:
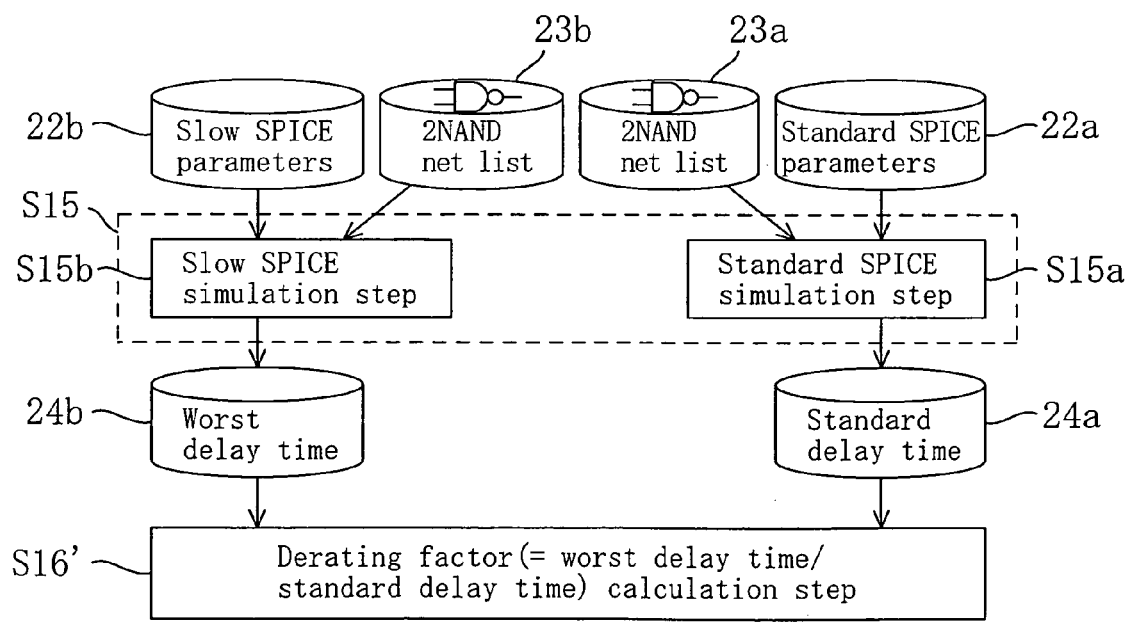
FIG. 22 is a diagram for showing variation ranges of process variables determined in a corner condition setting step S14 of FIG. 21.
FIG. 23 is a diagram for explaining, in detail, a circuit simulation step S15 and a subsequently performed LSI delay variation prediction step S16 of FIG. 21.

Furthermore, as shown in FIG. 3, one line segment is formed by joining the points A through D with a line, and the one straight line 130 is formed by extending the line segment. The straight line 130 thus formed means the following:

As described with reference to FIG. 19, when a logic circuit included in an LSI is decomposed, a plurality of circuit cells and a plurality of signal paths for connecting these circuit cells are obtained. In particular, the speed of a signal propagated through the signal path connecting static circuit cells as shown in FIG. 19 is the lowest when the drain currents of both an NMOS transistor and a PMOS transistor included in the circuit cell have the minimum values, and on the contrary, is the highest when the drain currents of both the NMOS transistor and the PMOS transistor have the maximum values. Therefore, the corner condition (that is, the upper and lower limits of a parameter of circuit simulation) necessary for timing verification in designing the logic circuit can be approximately regarded to be set on the straight line 130 of FIG. 3. In other words, a two-dimensional normal distribution function approximating the distributions of the two dimensions of the NMOS distribution 130n and the PMOS distribution 130p is expressed as an ellipse shown in FIG. 2, but the corner condition to be set with respect to the drain currents of the NMOS transistor and the PMOS transistor of the logic circuit composed of the static circuit cells can be expected to be set on the straight line 130 of FIG. 3 in consideration of the feature of the logic circuit. Also, it can be said that the straight line 130 of FIG. 3 approximately represents the relationship between the drain current of the NMOS transistor and the drain current of the PMOS transistor.

Next, in a SPICE parameter extraction step S104, SPICE parameters to be used in a SPICE simulation step S105 described later are extracted on the basis of the measurement result shown in FIG. 2. At this point, some of the SPICE parameters are changed into variables so that the relationship between the drain current of the NMOS transistor and the drain current of the PMOS transistor can satisfy the relationship corresponding to the straight line 130 of FIG. 3. An example of a condition for obtaining such variables is shown in FIG. 5.

FIG. 5 is a table for showing the condition for the SPICE parameters changed into the variables so that the relationship between the drain current of the NMOS transistor and the drain current of the PMOS transistor can satisfy the relationship corresponding to the straight line 130 of FIG. 3.

As shown in FIG. 5, for example, three process variables of a gate length, a threshold voltage and a gate oxide film thickness of the MOS transistor are assumed to be employed as the SPICE parameters in the form of the variables. In this case, the variation ranges at the points A through D of FIG. 3 are proportions as shown in FIG. 5 on the basis of, for example, fitting of the current-voltage characteristic measured in the test chip evaluation step S103. Each of these proportions is a ratio expressed as a percentage to the standard value of each SPICE parameter. Specifically, the variation ranges of the SPICE parameters shown in FIG. 5 correspond to a condition for reducing the drain current along the straight line 130 of FIG. 3 in the order of the points A, B, C and D obtained by changing the three SPICE parameters of the NMOS transistor and the PMOS transistor into the variables. It is noted that the SPICE parameters are specifically described in, for example, "Star Hspice Manual (released on May 2, 2000) published by Avant! Corporation, U.S.A.

Next, in the SPICE simulation step S105, the Monte Carlo analysis is performed with a circuit simulator by using the SPICE parameters changed into the variables under the aforementioned condition and by using a circuit model 120 of the LSI. The Monte Carlo analysis is a statistical analysis method in which random numbers generated in accordance with a specific probability distribution are used as input variables, general analysis is repeatedly performed with respect to each of the random numbers, and the resultant analysis results are synthesized to obtain a probability distribution as an output. As the circuit simulator, for example, HSPICE manufactured by Synopsys Inc., U.S.A is used. Also, the SPICE parameters in the form of the variables herein used are the three variables of the gate length, the threshold value and the gate oxide film thickness shown in FIG. 5. Furthermore, in the test chip evaluation step S103, distributions of process variables apart from three SPICE parameters (such as the gate length) are measured.

Now, the SPICE simulation performed in the SPICE simulation step S105 will be specifically described.

FIG. 6 is a diagram for showing the distributions of those three process variables input to the circuit simulator, the distribution of the drain current of the MOS transistor to be analyzed by using a random number set (a set of the SPICE parameters) in accordance with the distribution of the input process variables, and the distribution of a signal propagation delay time to be output from the circuit simulator (hereinafter referred to as the delay distribution).

As shown in FIG. 6, those three process variables (such as the gate length) shown in FIG. 5 extracted in the SPICE parameter extraction step S104 are input to the circuit simulator, and random numbers in accordance with these distributions are generated and changed by the circuit simulator. At this point, since those three normal random numbers according to the three process variables are correlated with one another, one normal random number is first generated in the circuit simulator, and three normal random numbers correlated with one another are generated thereafter. When those three normal random numbers are generated, one group of SPICE parameters such as the gate length is generated with respect to one group of random number set within the circuit simulator. It is noted that a pair of current-voltage characteristics of the NMOS and PMOS transistors generated on the basis of the one group of SPICE parameters generated at this point are set to satisfy the relationship corresponding to the straight line 130 of FIG. 3 as described above. When the SPICE parameters are generated, a delay time is calculated (with respect to each random number set), and the delay distribution is output as the distribution of the whole delay time on the basis of each set of the SPICE parameters. If the input process variable is one that can be changed into a variable also in the format of a net list like the gate length, the corresponding variable of the net list may be changed. Herein, a normal distribution is provided which has a standard deviation indicating total variation that each variable such as gate length has. It may be considered that the distribution of the total variation is superposition of various variation components such as inside-chip variations, outside-chip variation. Accordingly, it is possible that the normal distribution having the standard deviation for each variation component is assumed for each variation component, a normal random number is generated for each variation component, and then, Monte Carlo simulation is performed with the normal random number provided to a circuit in a given manner. As the circuit model 120 used in the SPICE simulation, a net list of a critical path that has the slowest signal propagation speed among the signal paths of the logic circuit included in the LSI is extracted. The format of such a net list is described in, for example, "Star-Hspice Manual" (released in May 2, 2000) published by Avant! Corporation, U.S.A. FIG. 6 also shows the corner condition (the upper and lower limits) of the delay time employed in the conventional method.

Next, in the derating factor calculation step S106, a worst delay time and a standard delay time are calculated on the basis of the delay distribution calculated in the SPICE simulation step S105, and a derating factor related to the fabrication variation is calculated by substituting the worst delay time and the standard delay time in the formula (5) (described in "Background of the Invention"). Specifically, the standard delay time is a delay time obtained when the drain currents of the MOS transistors correspond to the point A ($\mu_n$, $\mu_p$) of FIG. 3. On the other hand, if the worst delay time is a delay time obtained when the drain currents of the MOS transistors correspond to any of the point B ($\mu_n-\sigma_n$, $\mu_p-\sigma_p$), the point C ($\mu_n-2\sigma_n$, $\mu_p-2\sigma_p$) and the point D ($\mu_n-3\sigma_p-3\sigma_p$) of FIG. 3, derating factors $P_1$, $P_2$ and $P_3$ respectively corresponding to these points are respectively calculated by the following formulas (6), (7) and (8):

$$P_1 = t_{pd}(\mu_n-\sigma_n, \mu_p-\sigma_p)/t_{pd}(\mu_n, \mu_p) \quad \text{Formula (6):}$$

$$P_2 = t_{pd}(\mu_n-2\sigma_n, \mu_p-2\sigma_p)/t_{pd}(\mu_n, \mu_p) \quad \text{Formula (7):}$$

$$P_3 = t_{pd}(\mu_n-3\sigma_n, \mu_p-3\sigma_p)/t_{pd}(\mu_n, \mu_p) \quad \text{Formula (8):}$$

whereas $t_{pd}(\text{Id}_n, \text{Id}_p)$ indicates a delay time of a critical path obtained by using, as variables, the saturation drain current $\text{Id}_n$ of the NMOS transistor and the saturation drain current $\text{Id}_p$ of the PMOS transistor.

FIG. 7 is a table for showing the relationship between the saturation drain currents at the points A through D of FIG. 3 and the derating factors calculated in accordance with the formulas (6) through (8).

As shown in FIG. 7, the relationship between the saturation drain current of the MOS transistor and the derating factor is nonlinear (whereas a delay yield listed in FIG. 7 will be described later).

Next, in a delay yield calculation step S107, a delay yield $Y(t_{pd})$ corresponding to a cumulative probability distribution of the delay distribution calculated in the SPICE simulation step S105 is calculated. Specifically, the delay yield $Y(t_{pd})$ is calculated in accordance with the following formula (9) for integrating a normal distribution $N(\mu, \sigma^2)$ having the expected value (standard value) $\mu$ and the standard deviation $\sigma$:

Formula (9):

$$Y(t_{pd}) = \int_{-\infty}^{t_{pd}} N(\mu, \sigma^2) dt$$

The delay yield $Y(t_{pd})$ calculated in accordance with the formula (9) is shown in FIG. 7.

As shown in FIG. 7, as the value of the derating factor P is increased, the value of the delay yield is also increased. In other words, as the value of the derating factor P is larger, the delay time required of the LSI is released, and hence, the number of LSIs regarded as defectives is reduced. As shown in FIG. 7, when the delay time has the standard value, the delay yield is 0.5 (50%), and the upper limit of the delay yield is 1.0 (100%).

Next, in a prediction function specifying step S108, a prediction function indicating the relationship between the derating factor $P(t_{pd})$ calculated in the derating factor calculation step S106 and the delay yield $Y(t_{pd})$ calculated in the delay yield calculation step S107 is determined as shown in FIG. 8.

FIG. 8 is a graph for showing the relationship between the derating factor $P(t_{pd})$ and the delay yield $Y(t_{pd})$.

As shown in FIG. 8, in a derating factor setting step S109, on the basis of the relationship between the derating factor P and the delay yield Y determined in the prediction function specifying step S108, an expected yield 121 required as the delay yield of the LSI is set. For example, when the delay yield of 90% is required, the derating factor is set to 1.15 as the design margin. When the design margin is thus set, since a derating factor corresponding to the set expected yield 121 can be calculated on the basis of the relationship shown in FIG. 8, the calculated derating factor can be set as the design margin against the fabrication variation. It is noted that the worst delay time $t_{worst}$ as a whole can be calculated in accordance with the following formula (10) on the basis of the worst values of the derating factor P (corresponding to $P_{worst}$ in the formula (10)) related to the fabrication variation for attaining the expected yield 121, the derating factor V related to the power voltage range and the derating factor T related to the temperature range:

$$t_{worst} = t_{typ} \times P_{worst} \times V_{worst} \times T_{worst} \quad \text{Formula (10):}$$

As described so far, in Embodiment 1, the transistor characteristics (such as the current-voltage characteristics of the MOS transistors) are measured by using the test chip in the test chip evaluation step S103, and the SPICE simulation can be performed on the basis of the measured transistor characteristics. Therefore, the delay distribution obtained in consideration of a variation component of the transistor characteristic derived from the fabrication variation can be calculated. Accordingly, a realistic design margin neither excessive nor insufficient can be set against the fabrication variation of the LSI.

Also, in Embodiment 1, the relationship between the derating factor and the delay yield can be determined in the prediction function specifying step S108. Therefore, an appropriate derating factor (namely, an appropriate design margin) for attaining the expected yield can be easily calculated merely by determining the expected yield required of the LSI to be fabricated. Furthermore, as shown in FIG. 6, a corner condition more appropriate and realistic than that set by the conventional method can be set.

Furthermore, in Embodiment 1, merely the case where the drain currents of the NMOS transistor and the PMOS transistor are both increased or reduced is dealt with as shown with the straight line 130 in FIG. 3, and therefore, the processing up to the setting of the derating factor can be efficiently and easily performed.

Moreover, in Embodiment 1, the information of the critical path extracted as the slowest signal path among the signal paths of the logic circuit of the LSI is described in the format of the net list of the circuit model 120 used in the SPICE simulation step S105. Therefore, the delay yield of the LSI can be more accurately predicted through the SPICE simulation using the net list describing the critical path.

In Embodiment 1, the relationship between the drain current of the NMOS transistor and the drain current of the PMOS transistor is limited to the relationship corresponding to the straight line 130 shown in FIG. 3. In the case where it is difficult to give process variables for attaining the relationship corresponding to the straight line 130, however, the relationship between the drain current of the NMOS transistor and the drain current of the PMOS transistor may be a relationship corresponding to a region sandwiched between a straight line 131 and a straight line 132 shown in FIG. 9. Also, in the case where a nonlinear relationship between the drain current of the NMOS transistor and the drain current of the PMOS transistor is considered, the straight lines 130, 131 and 132 may be changed into curves.

Although all the processing is performed in Embodiment 1 on the assumption that the NMOS distribution 130n and the PMOS distribution 130p are the normal distributions, these distributions need not be normal distributions.

Furthermore, although the current-voltage characteristics of the MOS transistors are measured by using the test chip in Embodiment 1, another characteristic may be measured instead.

Moreover, in Embodiment 1, the delay yield and the derating factor obtained when the saturation drain currents of the MOS transistors are $\mu$, $(\mu-\sigma)$, $(\mu-2\sigma)$ and $(\mu-3\sigma)$ as shown in FIG. 7 are described. This interval of the saturation drain current is a value set for the sake of explanation alone, and hence the interval may have an arbitrary value.

Although a plurality of test chips are prototyped in the test chip prototype step S102 of Embodiment 1, merely one test chip may be prototyped so as to measure the current-voltage characteristics of a plurality of MOS transistors mounted on this test chip.

Embodiment 2

Now, a method for setting a design margin for an LSI according to Embodiment 2 of the invention will be described with reference to the accompanying drawings.

As a characteristic of Embodiment 2, a design margin against the fabrication variation is set by taking not only the variation component of the transistor characteristic described in Embodiment 1 but also a variation component of the wiring characteristic of the LSI into consideration as the delay varying factor of the logic circuit included in the LSI.

Therefore, the characteristic part of this embodiment will be described particularly in detail.

FIG. 1 is a diagram for showing procedures in the method for setting a design margin for an LSI of Embodiment 2, in particular, in which the design margin against the fabrication variation is set by regarding, as the delay varying factor, the variation component of the characteristic of a CMOS transistor, that is, a kind of CMIS transistor and the variation component of the wiring characteristic of the LSI.

As shown in FIG. 1, first in a test chip design step S101, a test chip mounting a variety of transistors and wirings to be included in an LSI to be fabricated is designed.

Next, in a test chip prototype step S102, a plurality of test chips designed in the test chip design step S101 are prototyped.

Then, in a test chip evaluation step S103, for example, the current-voltage characteristics of NMOS transistors and PMOS transistors out of the various transistors mounted on the test chips prototyped in the test chip prototype step S102 are measured and as the wiring characteristic, for example, a wiring width, a wiring film thickness and an interlayer film thickness are respectively measured. On the basis of the current-voltage characteristics of the NMOS transistor and the PMOS transistor measured at this point, the graph of FIG. 2 described in Embodiment 1 is similarly obtained.

Next, by using the actually measured wiring width, wiring film thickness and interlayer film thickness as parameters, the distribution of wiring capacitance is calculated through the Monte Carlo analysis using a field solver (that is, a kind of electromagnetic simulator). As the field solver, for example, software Raphael manufactured by Synopsys Inc., U.S.A. is used.

First, distributions of the actually measured wiring width, wiring film thickness and interlayer film thickness are input to be analyzed with the field solver while generating random numbers in accordance with these distributions. At this point, since the variation component of the transistor characteristic and the variation component of the wiring characteristic can be regarded as independent of each other, and also since the three random numbers in accordance with the distributions of the three process variables related to the wiring are correlated with one another, one normal random number is first generated for the wiring, and three normal random numbers correlated with one another are generated thereafter. When the three normal random numbers thus generated are changed, the wiring capacitance in accordance with each group of random number sets is calculated, and a wiring capacitance distribution as a whole of the wiring capacitance on the basis of each random number set is obtained. Also, a standard value (such as an expected value) $\mu_c$ and a standard deviation $\sigma_c$ of the output wiring capacitance distribution are calculated.

The speed of signal propagation through a signal path for connecting a plurality of circuit cells included in a logic circuit of an LSI has, in addition to the characteristic described in Embodiment 1 that the speed is reduced as the drain currents of an NMOS transistor and a PMOS transistor are both reduced and is increased as the drain currents are both increased, a characteristic that the speed is reduced as wiring capacitance is increased and is increased as the wiring capacitance is reduced. Herein, as a wiring for connecting the circuit cells, a simple wiring structure in which a single wiring is present on a substrate is assumed. Thus, the conditions for, for example, reducing the signal propagation speed, namely, the conditions for reducing the drain currents of both the NMOS transistor and the PMOS transistor and for increasing the wiring capacitance, are set in the same manner as in Embodiment 1. Among these conditions, those related to the wiring capacitance are listed in FIG. 10.

Figures 9, 10:
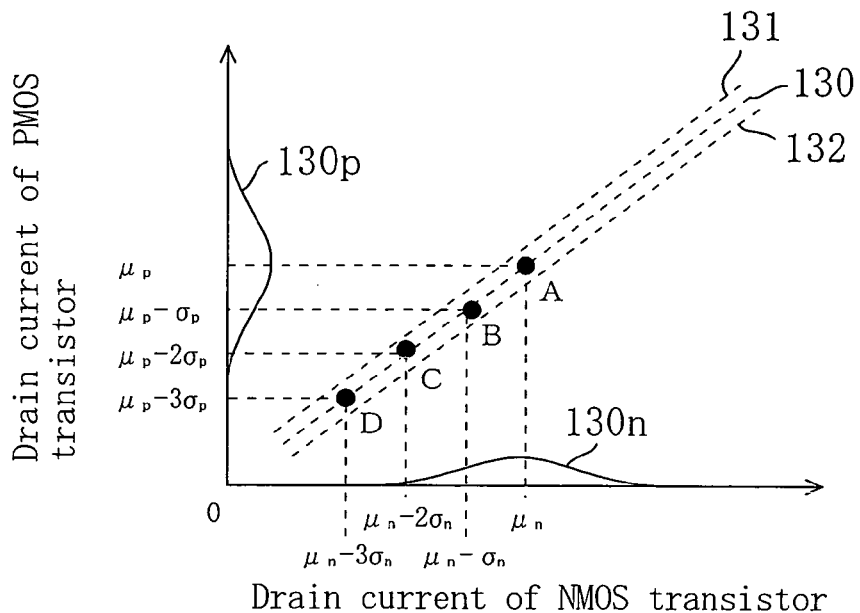
FIG. 9 is a diagram for showing an example of the condition different from that shown in FIG. 3.
FIG. 10 is a diagram for showing variation ranges of respective process variables used as a condition in the case where fabrication variation derived from a wiring characteristic is regarded as a delay varying factor in a method for setting a design margin for an LSI according to Embodiment 2 of the invention.

FIG. 10 is a diagram for showing the variation ranges of the respective process variables used as the conditions when the variation component of the wiring characteristic is regarded as the delay varying factor. In FIG. 10, the columns E, F, G and H respectively indicate the cases where the calculated wiring capacitance has values $\mu_c$, $(\mu_c-\sigma_c)$, $(\mu_c-2\sigma_c)$ and $(\mu_c-3\sigma_c)$. Also, the three process variables (such as the gate length) related to the transistor characteristic are assumed to be the same as those of Embodiment 1.

Next, in a SPICE parameter extraction step S104, SPICE parameters used in a SPICE simulation step S105 are extracted in the same manner as in Embodiment 1.

Then, in the SPICE simulation step S105, random numbers related to the transistor characteristic and the wiring characteristic in accordance with the input process variables are generated, and the SPICE simulation is performed by using the random number sets. At this point, however, normal random numbers for the wiring capacitance on the basis of the standard value $\mu_c$ and the standard deviation $\sigma_c$ calculated in the test chip evaluation step S105 are made to influence the circuit simulation in this embodiment. Specifically, wiring capacitance $C_{original}$ described in a net list of a circuit model 120 is replaced with a wiring capacitance distribution $C_{montecarlo}$ having the standard value $\mu_c$ and the standard deviation $\sigma_c$ calculated with the field solver and wiring capacitance C scaled by using the standard value in accordance with the following formula (11). Thus, a new net list is created.

$$C=C_{original} \times C_{montecarlo}/\mu_c \qquad \text{Formula (11):}$$

Specifically, the random numbers necessary for considering the fabrication variation component of the transistor characteristic are generated so as to influence the SPICE parameters as in Embodiment 1, and in addition, in this embodiment, the random numbers necessary for considering the variation component of the wiring characteristic are independently generated so as to influence the net list. Then, a delay time in accordance with each of the generated random number sets (each including six random numbers consisting of random numbers for the transistor characteristic and random numbers for the wiring characteristic in this embodiment) is calculated by the circuit simulator, and therefore, a distribution of the signal propagation delay time (delay distribution) as a whole is output. A conceptual diagram of this distribution is shown in FIG. 11.

FIG. 11 is a diagram for showing the distributions of the process variables input to the circuit simulator, the distributions of the drain currents of the MOS transistors and the wiring capacitance analyzed by using the random number sets (namely, a set of SPICE parameters and a set of parameters of the net list) in accordance with the input distributions of the process variables, and the delay distribution output from the circuit simulator.

As shown in FIG. 11, in this embodiment, in addition to the three process variables of Embodiment 1 shown in FIG. 6, the random numbers in accordance with the distributions of the wiring width, the wiring film thickness and the interlayer film thickness are generated, and the generated random number sets are used as the parameters of the net list of the circuit model 120. The wiring capacitance calculated within the circuit simulator on the basis of the parameters of the net list is set to satisfy the conditions shown in FIG. 10. Also, not only the fabrication variation of the transistors described in Embodiment 1 but also the fabrication variation of the wiring are made to influence the delay distribution ultimately output from the circuit simulator.

The subsequent procedures from a derating factor calculation step S106 to a derating factor setting step S109 are the same as those of Embodiment 1 and hence the description is omitted. The relationship between a delay yield and a derating factor determined in a prediction function specifying step S108 is shown in FIG. 12.

As described so far, according to Embodiment 2, the following effects can be attained in addition to the effects attained by Embodiment 1.

In Embodiment 2, the variation component of the wiring characteristic of the test chip is measured in the test chip evaluation step S103 and the SPICE simulation can be performed on the basis of the measured wiring characteristic. Therefore, the delay distribution can be calculated on the basis of not only the variation component of the transistor characteristic but also the variation component of the wiring characteristic. Accordingly, a realistic design margin neither excessive nor insufficient can be set against the fabrication variation.

Furthermore, in Embodiment 2, the SPICE simulation can be performed under the conditions that the wiring capacitance used within the circuit simulator is reduced when the drain currents of both the NMOS transistor and the PMOS transistor are increased and is increased when the drain currents are reduced. Therefore, the processing up to the setting of the derating factor can be efficiently and easily performed.

In Embodiment 2, the wiring structure of the LSI is assumed to be a simple one structure and the dimension of the wiring calculated on the basis of the assumed structure is applied to all the wirings (wiring capacitance elements) described in the net list of the circuit model 120 in the SPICE simulation step S105. However, the wiring structure of the LSI may be classified into plural structures, so as to calculate, with the field solver, distributions of wiring capacities on the basis of the respective classified wiring structures. Specifically, in the SPICE simulation step S105, wiring capacitance distributions in accordance with wiring capacitance elements may be used in such a manner that a first wiring capacitance distribution $D_1$ is applied to a first wiring capacitance element $C_1$ described in the format of the net list of the circuit model 120 and a second wiring capacitance distribution $D_2$ is applied to a second wiring capacitance element $C_2$.

Also, although the variation component of the transistor characteristic and the variation component of the wiring characteristic are regarded as independent of each other in the SPICE simulation step S105 of Embodiment 2, these components may be regarded as correlated with each other. In this case, one normal random number is generated and six correlated normal random numbers for the transistor characteristic and the wiring characteristic are generated thereafter in the SPICE simulation step S105.

Although the design margin is set on the basis of the variation component of the wiring capacitance in Embodiment 2, the design margin may be set on the basis of a variation component of wiring resistance. In this case, resistance $R_{original}$ described in the net list of the circuit model 120 used in the SPICE simulation step S105 is replaced with wiring resistance $R_{montecarlo}$ calculated through the Monte Carlo analysis and wiring resistance R scaled by using the standard number $\mu$ of the wiring resistance in accordance with the following formula (12):

$$R = R_{original} \times R_{montecarlo}/\mu \quad \text{Formula (12):}$$

Although all the processing are performed in Embodiment 2 on the assumption that the actually measured dimensions and the like of the wiring have normal distributions, the distributions need not be normal distributions.

Furthermore, although Embodiment 2 is described by exemplifying the case where the wiring width, the wiring film thickness and the interlayer film thickness are measured as the wiring characteristic, the procedures of this embodiment can be performed in a similar manner even when other process variables are measured.

Embodiment 3

A method for setting a design margin for an LSI according to Embodiment 3 of the invention will now be described with reference to the accompanying drawings.

Figure 13:
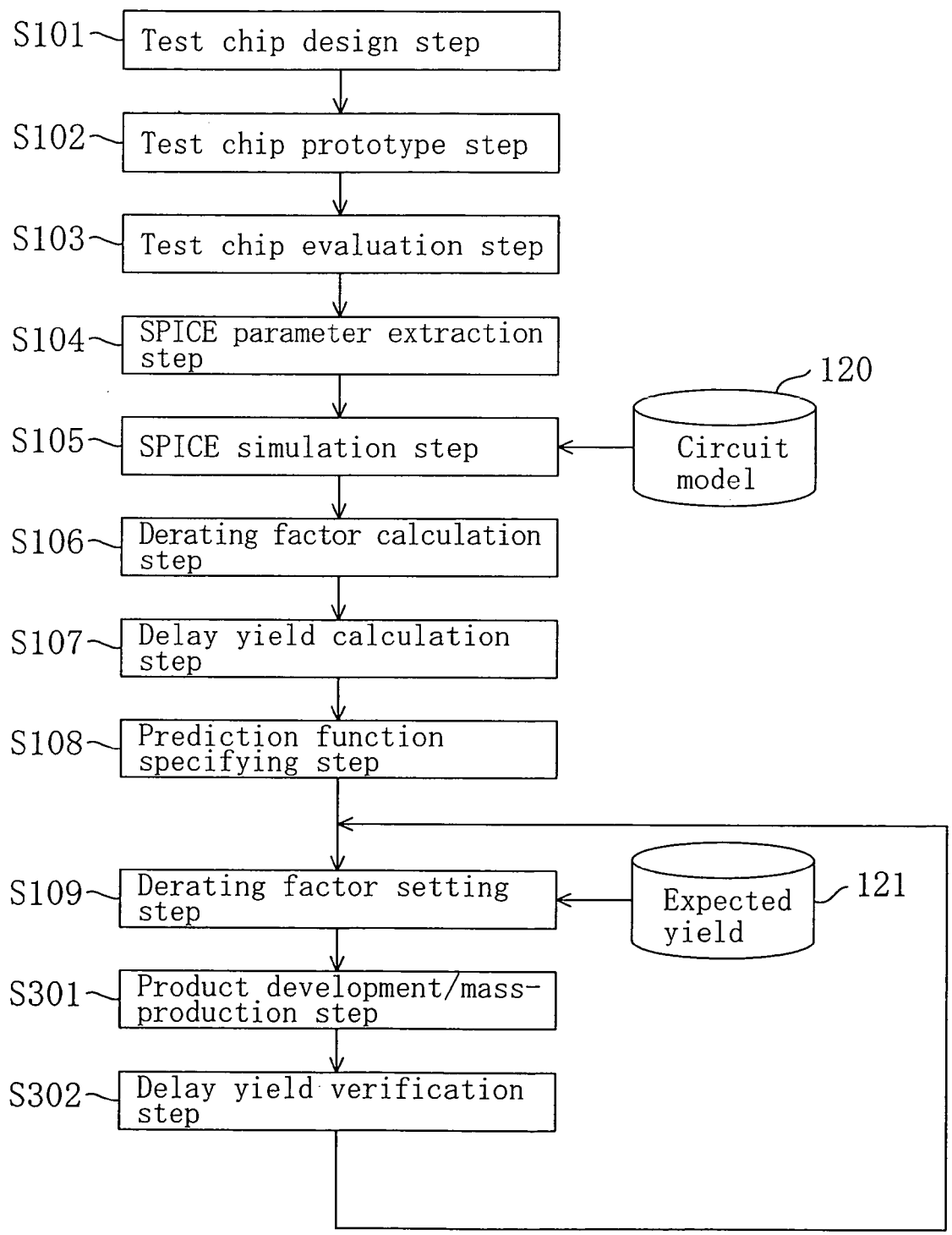
FIG. 13 is a diagram for showing procedures in a method for setting a design margin for an LSI according to Embodiment 3 of the invention.

FIG. 13 is a diagram for showing procedures in the method for setting a design margin for an LSI according to Embodiment 3. In Embodiment 3 shown in FIG. 13, the same procedures as those shown in FIG. 1 of the method for setting a design margin for an LSI according to Embodiment 1 are referred to by using the same reference numerals.

As shown in FIG. 13, as a characteristic of this embodiment, the method of this embodiment includes, in addition to the procedures up to the setting of a design margin described in Embodiment 1, a product development/mass-production step S301 of developing and mass-producing a product on the basis of the set design margin and a delay yield verification step S302 of correcting the design margin on the basis of the LSI actually fabricated as a product.

Specifically, in the product development/mass-production step S301, the LSI for which the design margin has been set in the derating factor setting step S109 is developed and mass-produced.

Next, in the delay yield verification step S302, the actual delay yield of the LSI mass-produced in the product development/mass-production step S301 is evaluated. Specifically, a difference between the actual delay yield (actually measured yield) of the LSI and an expected delay yield (predicted yield) set in the derating factor setting step S109 is calculated. The difference between the actually measured yield of the LSI and the predicted yield set in the derating factor setting step S109 derives from the accuracy of the SPICE parameters extracted in the SPICE parameter extraction step S104, the accuracy of the circuit model 120 used in the SPICE simulation step S105, the accuracy of the SPICE simulation itself and the like.

Next, in the derating factor setting step S109, on the basis of the difference, calculated in the delay yield verification step S302, between the actually measured yield of the LSI and the predicted yield set in the derating factor setting step S109 before the development/mass-production of the LSI, the relationship between the derating factor and the delay yield determined in the prediction function specifying step S108 is corrected. The relationships between the derating factor and the delay yield obtained before and after the correction are shown in FIG. 14.

Figure 14:
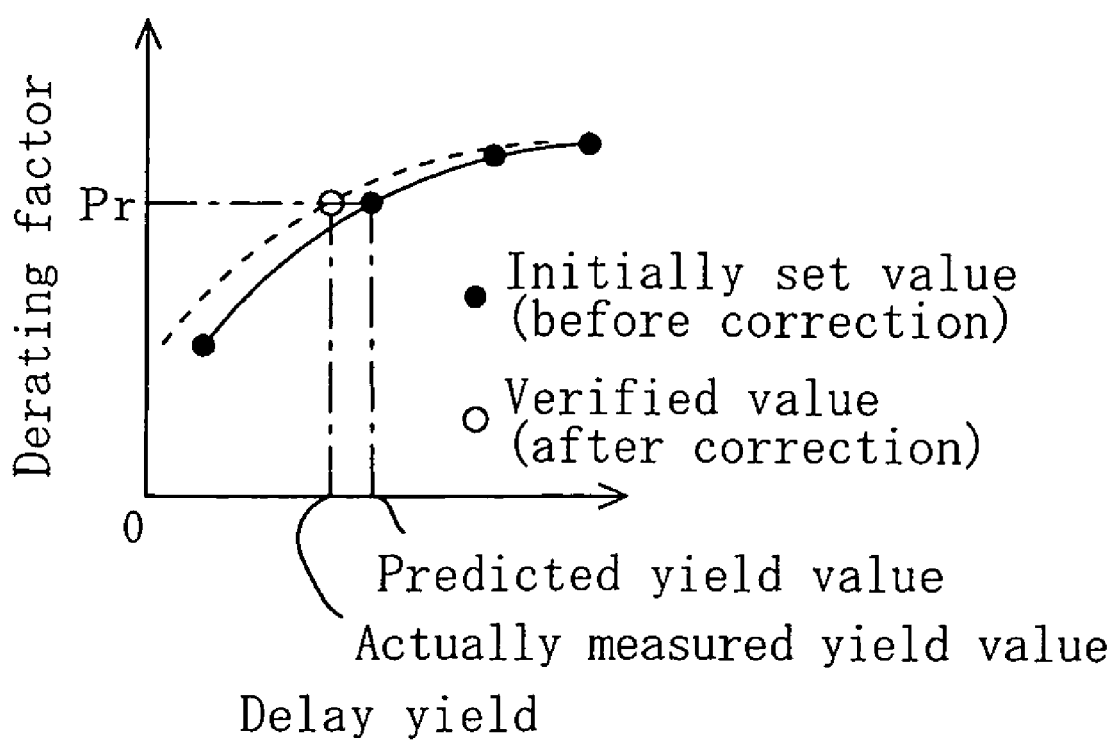
FIG. 14 is a diagram for showing the relationship between a derating factor and a delay yield determined in a prediction function specifying step S108 of FIG. 13 (shown with a solid line) and a corrected relationship obtained by correcting the relationship on the basis of an evaluation result obtained in a delay yield verification step S302 (shown with a broken line)

FIG. 14 is a diagram for showing the relationship between the derating factor and the delay yield determined in the prediction function specifying step S108 (shown with a solid line) and the relationship corrected on the basis of the calculation result of the delay yield verification step S302 (shown with a broken line).

As shown in FIG. 14, when the predicted yield is first set in the derating factor setting step S109, a derating factor Pr is obtained on the basis of a predicted function between the delay yield and the derating factor prior to the correction shown in FIG. 14 (with the solid line). It is assumed that when the actual LSI developed by using the derating factor Pr is evaluated after the mass-production, the delay yield of this LSI has an actually measured yield value shown in FIG. 14. In this case, the prediction function between the delay yield and the derating factor shown with the solid line is corrected to a function shown with the broken line. Then, the new relationship between the delay yield and the derating factor thus corrected is used for product development of the LSI thereafter.

As described so far, according to Embodiment 3, the actual delay yield (actually measured yield) of the LSI developed on the basis of the derating factor set in the derating factor setting step S109 can be evaluated in the delay yield verification step S302 after the mass-production of the LSI. Therefore, the difference between the predicted yield having been predicted before the development of the LSI and the actually measured yield actually evaluated after the development/mass-production of the LSI is fed back to the predicted function specifying step S108, so that the relationship between the delay yield and the derating factor can be appropriately corrected. Accordingly, the design margin can be more realistically and more accurately set for the LSI to be developed thereafter. Thus, setting of an excessive or insufficient design margin can be suppressed.

In the product development/mass-production step S301 of Embodiment 3, the number of kinds of products or the number of products to be developed and mass-produced are arbitrary.

Embodiment 4

A method for setting a design margin for an LSI according to Embodiment 4 of the invention will now be described with reference to the accompanying drawings.

Figure 15:
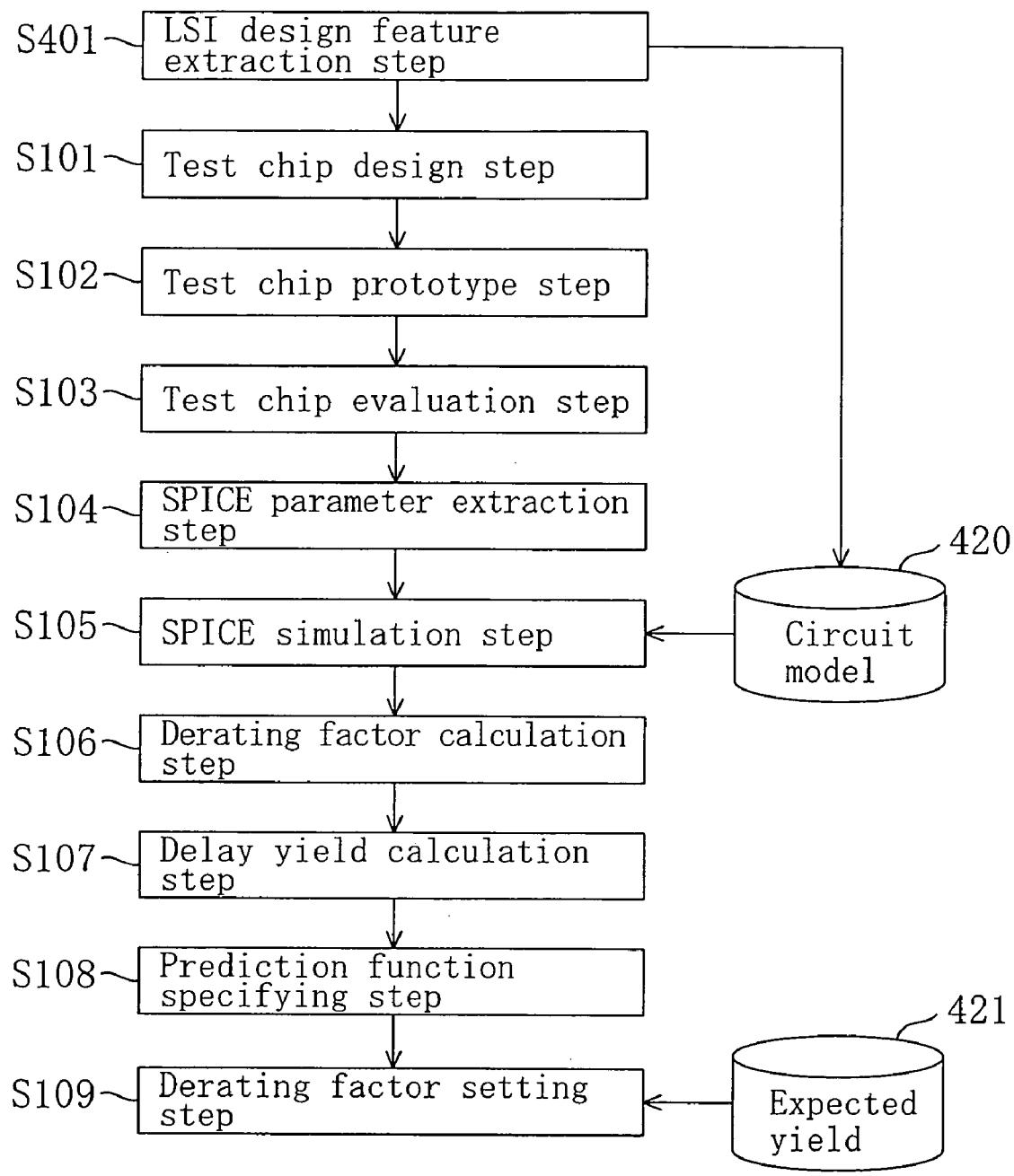
FIG. 15 is a diagram for showing procedures in a method for setting a design margin for an LSI according to Embodiment 4 of the invention.

FIG. 15 is a diagram for showing procedures in the method for setting a design margin for an LSI of Embodiment 4. In FIG. 15, the same procedures as those shown in FIG. 1 of the method for setting a design margin for an LSI according to Embodiment 1 are referred to by using the same reference numerals.

As shown in FIG. 15, as a characteristic of Embodiment 4, an LSI design feature extraction step S401 of classifying features of an LSI to be fabricated as a product into a plurality of types and extracting the classified types is performed before the test chip design step S101. Specifically, the design margin is set in consideration of both variation randomly caused due to the fabrication variation (random variation) and variation systematically caused (systematic variation). The random variation means variation to which, for example, fluctuation from the standard value of the delay time can be approximately applied as a normal distribution. On the other hand, the systematic variation means variation that can be approximately applied to, for example, regular "shift" of the standard value of the signal propagation delay time. Also, the systematic variation is caused depending upon a mask layout in lithography process in semiconductor fabrication processing.

Now, the characteristic part of Embodiment 4 will be described in detail.

First, in the LSI design feature extraction step S401, the LSI to be fabricated as a product is analyzed, so as to extract a critical path from signal paths for connecting the circuit cells of the logic circuit included in the LSI. Then, mask layouts of transistors included in the extracted critical path are classified.

Next, in the test chip design step S101, the test chip prototype step S102 and the test chip evaluation step S103, the prototyped test chip is used for typifying, for example, a shift of the saturation drain current of a MOS transistor from the standard value in a manner as shown in the following formulas (13a) and (13b), and each type is expressed as dependency of a layout variable.

$$\Delta I_A = f_A(L, W, S_1, S_2, \text{etc.}) \quad \text{Formula (13a):}$$

$$\Delta I_B = f_B(L, W, S_1, S_2, \text{etc.}) \quad \text{Formula (13b):}$$

wherein $\Delta I_A$ indicates the drain current shift of a type A, $\Delta I_B$ indicates the drain current shift of a type B, L indicates the gate length of the MOS transistor, W indicates the gate width thereof, and $S_1$ and $S_2$ indicate dimensions of various parts of the layout of the transistor.

Each of the types (i.e., the type A and the type B) corresponds to the basic shape of a layout applicable as a unit of the layout dependency. FIG. 16 shows examples of the layout variables such as the gate length of MOS transistors typified in the aforementioned manner.

FIG. 16 is a diagram for showing examples of the layout variables obtained by typifying MOS transistors included in the critical path in the logic circuit.

As shown in FIG. 16, the MOS transistors included in the critical path can be classified by using the layout variables (the gate length and the like) indicating the dimensions of the respective parts of the layouts and by using the classified types such as the type A and the type B. Specifically, one of the typified MOS transistors (such as a transistor Tr1 and the like) is determined as a standard transistor, and the shift $\Delta I$ in a current distribution based on the current distribution of the standard transistor is calculated in accordance with the formula (13a) or (13b) by using the various layout variables as parameters. More specifically, the MOS transistors included in the critical path are typified on the basis of the dimensions of the respective layout parts, and the shift of each MOS transistor typified depending upon the dimensions is calculated in accordance with the formula (13a) or (13b) on the basis of the layout dependency.

Next, in the SPICE parameter extraction step S104, the SPICE parameters of the transistor set as the standard transistor are changed into variables in the same manner as in Embodiment 1.

Then, in the SPICE simulation step S105, the Monte Carlo analysis is performed by using the SPICE parameters extracted in the SPICE parameter extraction step S104, a circuit model 420 that influences the types of the respective transistors extracted in the LSI design feature extraction step S401, and a circuit simulator.

Specifically, first, by referring to the current shift shown in FIG. 16, a dummy current source having a current value corresponding to the current shift shown in FIG. 16 is inserted in parallel between the source and the drain of each MOS transistor described in the format of a net list of the circuit model 420. An example of this insertion is shown in FIG. 17.

FIG. 17 is a circuit diagram within the net list in which a dummy current source corresponding to the current shift on the basis of the current distribution of the standard transistor is inserted in the MOS transistor described in the net list of the circuit model 420.

As shown in FIG. 17, a dummy current source 431 corresponding to the current shift is inserted in parallel in a transistor 430 described in the net list of the circuit model 420. Thus, the systematic variation peculiar to each typified transistor can be taken into consideration in the circuit simulation using the circuit model 420. For example, in the case of the drain current of the NMOS transistor Tr1 shown in FIG. 16, if the random variation alone is taken into consideration, the current distribution of the transistor Tr1 approximated with a normal distribution is $N(\mu_n, \sigma_n^2)$, but when the systematic variation is also taken into consideration, the current distribution is $N(\mu_n \times 1.05, \sigma_n^2)$ as shown in FIG. 18. Thus, the standard value of the drain current is shifted when the systematic variation is considered. The Monte Carlo analysis is carried out in the same manner as in Embodiment 1 except that a dummy current source is inserted to the description of the net list of the circuit model 420. Therefore, the distributions of the process variables used as inputs in the Monte Carlo analysis and the distributions of the drain current and the delay time analyzed on the basis of the input distributions are as shown in FIG. 18.

FIG. 18 is a diagram for showing the distributions of the process variables to be input to a circuit simulator in the SPICE simulation step S105, the distribution of the drain current of a MOS transistor analyzed by using a random number set (a set of SPICE parameters) in accordance with the distributions of the input process variables, and the delay distribution output from the circuit simulator.

As shown in FIG. 18, random numbers in accordance with the distributions of the gate length, the threshold voltage and the gate oxide film thickness are generated and changed in the same manner as in Embodiment 1. Thus, since the dummy current source corresponding to the current shift has been written in the net list of the circuit model 420 input to the circuit simulator in this embodiment, the distribution of the drain current calculated within the circuit simulator is shifted. Accordingly, the distribution of the delay time to be output is similarly shifted. In other words, although the random variation is analyzed in the same manner as in Embodiment 1, the systematic variation is also taken into consideration in this embodiment by adding the dummy current source for supplying the shift current of the current distribution depending upon the layout, and the delay distribution is calculated on the basis of the systematic variation. The following steps S106 through S109 are the same as those of Embodiment 1 and hence the description is omitted.

As described so far, Embodiment 4 can attain the following effects in addition to the effects attained by Embodiment 1:

In Embodiment 4, the mask layouts of transistors included in the critical path of the logic circuit included in the LSI are typified in the LSI design feature extraction step S401, so that the two variation components of the random variation and the systematic variation derived from the fabrication variation of the LSI can be taken into consideration. Furthermore, the thus typified systematic variation is inserted as a dummy current source in the net list of the circuit model 420 used in the SPICE simulation, and therefore, the delay time (namely, the delay yield) influenced by the characteristic of the systematic variation can be calculated. Accordingly, an appropriate design margin can be set against the realistic fabrication variation of the LSI to be fabricated.

In the SPICE simulation step S105 of Embodiment 4, the dummy current source inserted in the net list of the circuit model 420 may be a voltage control type current source.

In the dilating factor calculation step S106, calculation is performed by the formula (5), similar to the formulae (6), (7) and (8). Wherein, in Embodiment 4, either a standard delay time in the case where the systematic variation is not taken into consideration or a standard delay time in the case where the systematic variation is taken into consideration may be used as the standard delay time of the denominator in the formula (5). In both the cases, a worst delay time in the case where the systematic variation is taken into consideration must be used as the worst delay time of the numerator in the formula (5).

What is claimed is:

1. A method for setting a design margin for an LSI comprising steps of:
   predicting a relationship between a design margin to be set against a fabrication variation in designing said LSI and a yield; and
   calculating a specific design margin for attaining a given yield based on said predicted relationship,
   wherein said yield is a delay yield obtained by cumulating a signal propagation delay time thereby achieving a probability that a signal propagated through a logic circuit of said LSI is delayed by a given amount of time, and
   said design margin is a derating factor indicating a ratio between said signal propagation delay time and a standard value of said signal propagation delay time.

2. The method for setting a design margin for an LSI of claim 1,
   wherein said relationship is predicted in the step of predicting a relationship by performing a circuit simulation using parameters including simulation information extracted from circuit characteristics of a test chip influenced by design features of said LSI based on a circuit model influenced by said design features of said LSI.

3. The method for setting a design margin for an LSI of claim 2,
   wherein said design features of said LSI influenced by said circuit model includes at least information about a critical path of said LSI.

4. The method for setting a design margin for an LSI of claim 1,
   wherein said predicted relationship is corrected based on a difference between said given delay yield and an actual delay yield of said LSI designed and fabricated based on said specific design margin.

5. A method for setting a design margin for an LSI in which a design margin to be employed in design of said LSI is set against a fabrication variation, comprising:
   a first step of measuring a circuit characteristic of said LSI by using a test chip influenced by a design feature of said LSI;
   a second step of constructing a circuit model influenced by said design feature of said LSI;
   a third step of extracting, at least from said circuit characteristic measured in the first step, simulation information necessary for a circuit simulation performed by using said circuit model constructed in the second step;
   a fourth step of performing said circuit simulation by using said simulation information extracted in the third step as parameters and by using said circuit model constructed in the second step, whereby calculating a delay yield obtained by cumulating a signal propagation delay time thereby achieving a probability that a signal propagated through a logic circuit of said LSI is delayed by a given amount of time, and a derating factor indicating a ratio between said signal propagation delay time and a standard value of said signal propagation delay time;
   a fifth step of determining a relationship between said delay yield and said derating factor calculated in the fourth step; and
   a sixth step of calculating a specific derating factor for attaining a given delay yield based on said relationship determined in the fifth step and setting said specific derating factor as a specific design margin against said fabrication variation.

6. The method for setting a design margin for an LSI of claim 5,
   wherein said simulation information extracted in the third step includes at least a variation component of a transistor characteristic derived from said fabrication variation.

7. The method for setting a design margin for an LSI of claim 6,
   wherein in said circuit simulation performed in the fourth step, said parameters are changed in such a manner that drain currents of an N-channel MIS transistor and a P-channel MIS transistor included in said circuit model are both increased or reduced.

8. The method for setting a design margin for an LSI of claim 5,
wherein said simulation information extracted in the third step includes at least a variation component of a transistor characteristic and a variation component of a wiring characteristic derived from the fabrication variation.

9. The method for setting a design margin for an LSI of claim 5,
wherein said simulation information extracted in the third step includes at least a random variation derived from the fabrication variation.

10. The method for setting a design margin for an LSI of claim 5,
wherein said simulation information extracted in the third step includes at least a random variation and a systematic variation derived from the fabrication variation.

11. The method for setting a design margin for an LSI of claim 10,
wherein said systematic variation is typified into a plurality of types based on dependency, on a mask layout, of a current passing through a transistor included in said circuit model.

12. The method for setting a design margin for an LSI of claim 10,
wherein in said circuit simulation performed in the fourth step, said systematic variation is expressed as a dummy current source connected in parallel to a transistor included in said circuit model.

13. The method for setting a design margin for an LSI of claim 5,
wherein said relationship is corrected based on a difference between said given delay yield and an actual delay yield of said LSI designed and fabricated based on said specific design margin.

14. A method for setting a design margin for an LSI comprising steps of:
predicting a relationship between a design margin to be set against a fabrication variation in designing said LSI and a yield; and
calculating a specific design margin for attaining a given yield based on said predicted relationship,
wherein said relationship is predicted in the step of predicting a relationship by performing a circuit simulation using parameters including simulation information extracted from circuit characteristics of a test chip influenced by design features of said LSI based on a circuit model influenced by said design features of said LSI.

15. The method for setting a design margin for an LSI of claim 14,
wherein said design features of said LSI influenced by said circuit model includes at least information about a critical path of said LSI.

* * * * *